US012785565B2

(12) United States Patent
Asahi

(10) Patent No.: US 12,785,565 B2
(45) Date of Patent: Nov. 3, 2026

(54) SWITCHING POWER SUPPLY DEVICE

(71) Applicant: DENSO CORPORATION, Kariya-city (JP)

(72) Inventor: Takashi Asahi, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 6 days.

(21) Appl. No.: 19/182,448

(22) Filed: Apr. 17, 2025

(65) Prior Publication Data

US 2025/0247004 A1 Jul. 31, 2025

Related U.S. Application Data

(63) Continuation of application No. PCT/JP2023/034958, filed on Sep. 26, 2023.

(30) Foreign Application Priority Data

Oct. 26, 2022 (JP) ................................ 2022-171487

(51) Int. Cl.
*H02M 3/158* (2006.01)
*H02M 3/07* (2006.01)
*H03K 17/06* (2006.01)

(52) U.S. Cl.
CPC ............. *H02M 3/158* (2013.01); *H02M 3/07* (2013.01); *H03K 17/063* (2013.01); *H03K 2217/0063* (2013.01)

(58) Field of Classification Search
CPC ........ H02M 3/158; H02M 3/07; H02M 3/155; H03K 17/063; H03K 2217/0063
See application file for complete search history.

(56) References Cited

U.S. PATENT DOCUMENTS

2017/0244320 A1 8/2017 Kawano et al.
2025/0247004 A1* 7/2025 Asahi .................. H03K 17/063
2025/0373148 A1* 12/2025 Chang ..................... H02M 1/08
2025/0373161 A1* 12/2025 Chen ..................... H02M 1/009
2025/0392217 A1* 12/2025 Farrenkopf ........... H02M 3/157

FOREIGN PATENT DOCUMENTS

JP 2011199972 A * 10/2011
JP 2022085364 A * 6/2022

* cited by examiner

*Primary Examiner* — Adam D Houston
(74) *Attorney, Agent, or Firm* — Nixon & Vanderhye P.C.

(57) ABSTRACT

A switching power supply device, for generating an output voltage by switching an input voltage using an N-channel MOSFET as a high side switch, includes: a bootstrap circuit that generates a drive power supply of the high side switch; an off time generation unit that sets a gate voltage of the high side switch to be high when a division voltage signal of the output voltage falls below a target voltage; an on time calculation unit that sets the gate voltage to be low according to comparison between a terminal voltage of a capacitor to be charged by the constant current and a voltage obtained by multiplying the output voltage by a gain; and a high level priority unit that prioritizes the gate voltage to be high when the off time generation unit is outputting a signal for setting the gate voltage to be high.

5 Claims, 14 Drawing Sheets

SWITCHING POWER SUPPLY DEVICE

CROSS REFERENCE TO RELATED APPLICATION

The present application is a continuation application of International Patent Application No. PCT/JP2023/034958 filed on Sep. 26, 2023, which designated the U.S. and claims the benefit of priority from Japanese Patent Application No. 2022-171487 filed on Oct. 26, 2022. The entire disclosures of all of the above applications are incorporated herein by reference.

TECHNICAL FIELD

The present disclosure relates to a switching power supply device that generates an output voltage transformed by switching an input voltage using a switching element.

BACKGROUND ART

In a step-down DC-DC converter, which is a type of switching power supply device, when the input voltage Vin is reduced to near the output voltage VOUT, it is desirable to drive the high-side switch by increasing the duty ratio of the PWM signal as high as possible in order to minimize the reduction in the output voltage.

On the other hand, when an N-channel MOSFET is used as the high-side switch and the gate drive voltage is generated by a bootstrap circuit, it is necessary to reduce the source potential of the high-side FET periodically to be the low level, that is, it is necessary to turn off the high-side FET, in order to charge the capacitance of the bootstrap circuit. If the bootstrap capacitance, that is, the boost capacitor, cannot be charged periodically, the voltage required to drive the high-side FET cannot be obtained, so that the high-side FET is in a half-on state.

To address the above-described issues, a technique is commonly used in which, when the input voltage is reduced, the high-side FET is operated at a constant high duty ratio to minimize the reduction in the output voltage while periodically charging the boost capacitor.

SUMMARY OF INVENTION

According to an example, a switching power supply device, for generating an output voltage by switching an input voltage using an N-channel MOSFET as a high side switch, may include: a bootstrap circuit that generates a drive power supply of the high side switch; an off time generation unit that sets a gate voltage of the high side switch to be high when a division voltage signal of the output voltage falls below a target voltage; an on time calculation unit that sets the gate voltage to be low according to comparison between a terminal voltage of a capacitor to be charged by the constant current and a voltage obtained by multiplying the output voltage by a gain; and a high level priority unit that prioritizes the gate voltage to be high when the off time generation unit is outputting a signal for setting the gate voltage to be high.

BRIEF DESCRIPTION OF THE DRAWINGS

The above and other features and advantages of the present disclosure will become more apparent from the following detailed description made with reference to the accompanying drawings. In the drawings.

DETAILED DESCRIPTION

In the COT (i.e., Constant On Time) control, which is a control method for a switching power supply device, the on time is fixed and the off time is determined by feedback control, thereby controlling the output voltage. Therefore, the on/off timing of the switch is not determined at a constant cycle, so that it is difficult to stably charge the boost capacitor. Furthermore, when the output voltage is reduced, the on time is controlled to be shorter, so that it causes a difficulty that a sufficiently high duty ratio cannot be obtained.

The present disclosure has been made in consideration of the above circumstances, and has an object to provide a switching power supply device that can stably charge a boost capacitor even in a configuration that an N-channel MOSFET is used as a high-side switch.

According to the switching power supply device of the present disclosure, an input voltage is switched by a high-side switch that is at least an N-channel MOSFET, and an output voltage which is transformed is generated. The bootstrap circuit has a boost capacitor having one end connected to the low potential side conduction terminal of the high side switch, and generates a drive power supply for driving the high side switch.

When the division voltage signal of the output voltage falls below a target voltage, the off-time generation unit sets the gate voltage of the high-side switch to a high level. The on-time calculation unit has a current source circuit in which the value of a constant current is adjusted depending on the input voltage, and sets the gate voltage of the high-side switch to a low level depending on the result of comparing the terminal voltage of a capacitor to be charged by the constant current with a voltage obtained by multiplying the output voltage by a gain. The high level priority unit prioritizes setting the gate voltage to a high level when the off time generation unit is outputting a signal for setting the gate voltage to a high level.

With this configuration, even if there is a conflict between the control by the off-time generation unit to set the gate voltage of the high-side switch to a high level and the control by the on-time calculation unit to set the gate voltage of the high-side switch to a low level, the gate voltage will be maintained at a high level by the high-level priority unit. Therefore, the boost capacitor of the bootstrap circuit can be charged for a longer period of time.

Furthermore, according to the switching power supply device of the present disclosure, the low level setting unit forcibly sets the gate voltage to a low level when the time during which the gate voltage remains at a high level exceeds a threshold value. As a result, even if the time during which the gate voltage shows a high level becomes longer as a result of a reduction in the input voltage, the low level setting unit can reliably charge the boost capacitor by turning off the high-side switch.

First Embodiment

Figure 1:
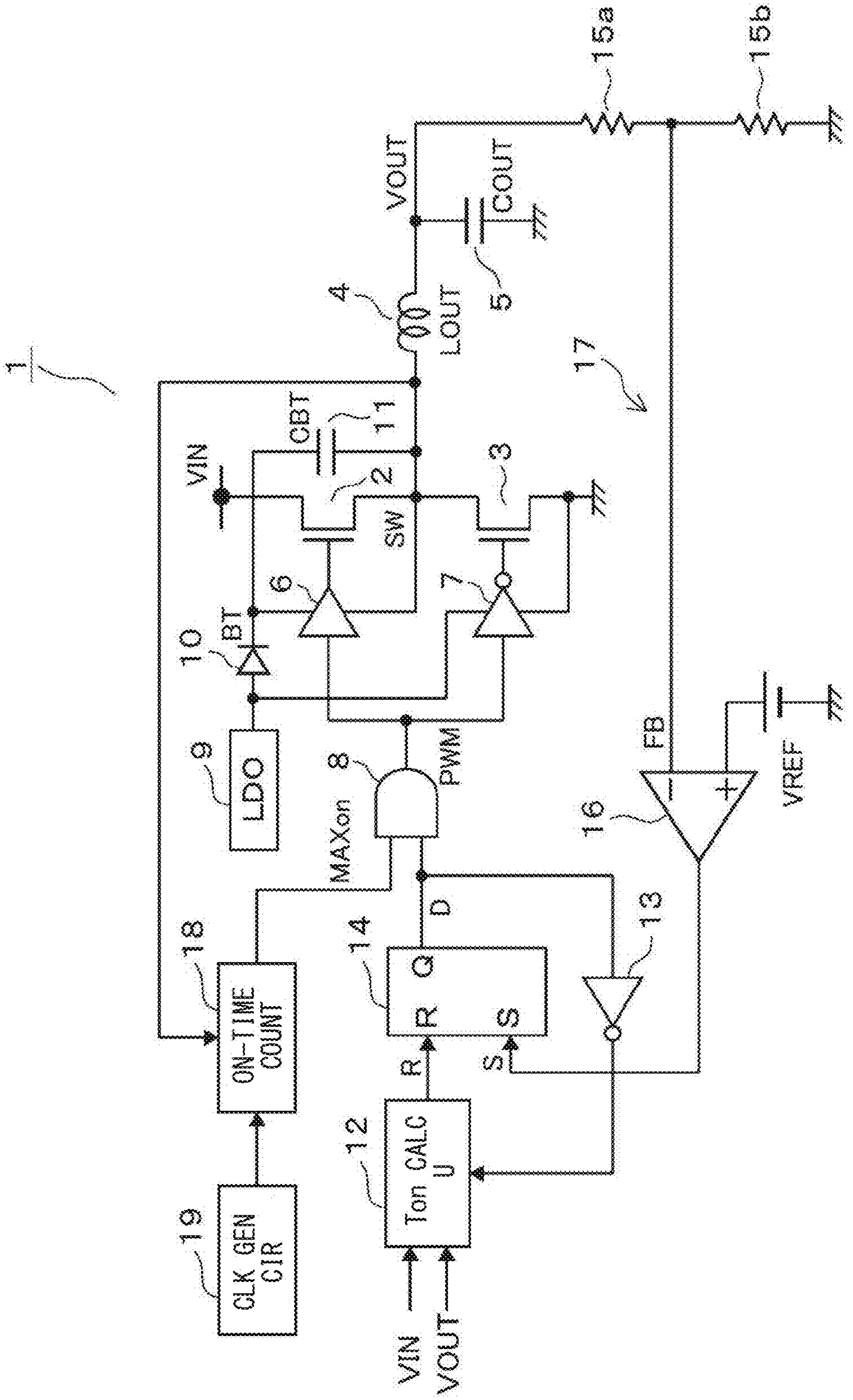
FIG. 1 is a diagram showing a configuration of a switching power supply device in a first embodiment.

Hereinafter, a first embodiment will be described. The switching power supply device 1 of this embodiment shown in FIG. 1 is a step-down switching power supply with COT control. A series circuit of a high-side switch 2 and a low-side switch 3, both of which are N-channel MOSFETs, is connected between a power supply VIN and the ground. A series circuit of an inductor 4 and a capacitor 5 is connected between the common connection point of the switches 2 and 3 and the ground.

The gate drive signals are applied to the gates of the high-side switch 2 and the low-side switch 3 via a driver 6 and an inversion driver 7, respectively. The input terminals of the drivers 6 and 7 are connected to the output terminal of an AND gate 8, and a PWM (i.e., Pulse Width Modulation) signal is input from the output terminal.

An LDO (i.e., Low Drop Out) 9 boosts the input voltage VIN to generate a drive power supply for the drivers 6 and 7 and supplies the power to the drivers 6 and 7. The output terminal of the LDO 9 is directly connected to the power supply terminal of the driver 7 and is also connected to the power supply terminal of the driver 6 via a diode 10. A boost capacitor 11 is connected between the cathode of the diode 10 and the common connection point of the switches 2 and 3. The source, which is the low potential side conduction terminal of the high-side switch 2, is connected to the common connection point. The LDO 9 and the boost capacitor 11 correspond to a bootstrap circuit.

The Ton calculation unit 12 receives the input voltage VIN, the output voltage VOUT, and a duty control signal D via a NOT gate 13. The Ton calculation unit 12 generates a reset signal R for the RS latch 14 based on these input signals and outputs the reset signal R to the reset terminal R.

The capacitor 5 is connected to a series circuit of resistor elements 15*a* and 15*b*. The common connection point of the resistor elements 15*a* and 15*b* is connected to the non-inversion input terminal of the comparator 16. A reference voltage or a target voltage VREF is applied to an inversion input terminal of the comparator 16, and an output terminal of the comparator 16 is connected to a set terminal S of the RS latch 14. The resistor element 15 and the comparator 16 constitute an off-time generation unit 17.

The RS latch 14 generates the above-mentioned duty control signal D from an output terminal Q, and outputs the duty control signal D to one input terminal of the AND gate 8. An input terminal of the ON time counter 18 is connected to the common connection point of the switches 2 and 3, and an output terminal of the ON time counter 18 is connected to the other input terminal of the AND gate 8. The RS latch 14 is a latch that prioritizes the set signal and sets the output terminal Q to a high level when a set signal and a reset signal are input simultaneously, and corresponds to a high level priority unit.

Figure 2:
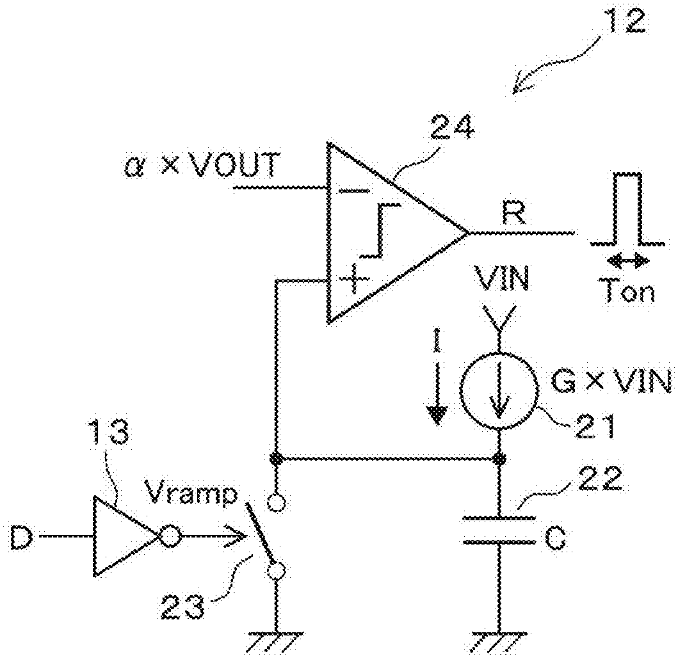
FIG. 2 is a diagram showing a configuration of a Ton time generation circuit.

As shown in FIG. 2, the Ton calculation unit 12 includes a series circuit of a current source circuit 21 and a capacitor 22 connected between a power supply VIN and the ground, and a comparison circuit, i.e., a comparator 24 having an inversion input terminal to which an a-fold value of the output voltage VOUT is input and a non-inversion input terminal connected to a common connection point of the current source circuit 21 and the capacitor 22. The comparator 24 is also connected to the ground via a switch circuit 23. The current source circuit 21 supplies a constant current I (=G×VIN) proportional to the input voltage VIN.

The switch circuit 23 is turned on by a signal DB which is an inversion of the duty control signal D. The off-time generation unit 17 compares the voltage FB obtained by dividing the output voltage VOUT with a reference voltage VREF, sets the RS flip-flop 14 in accordance with the result of the comparison, and sets the duty control signal D to a high level. Ton is the time during which the signal D maintains a high level, and is determined by the constant current charging of the capacitor 22. When the capacitance of the capacitor 22 is defined as C, then Ton=(VOUT×C)/(G×VIN). In other words, the time Ton is inversely proportional to the input voltage VIN.

Figure 3:
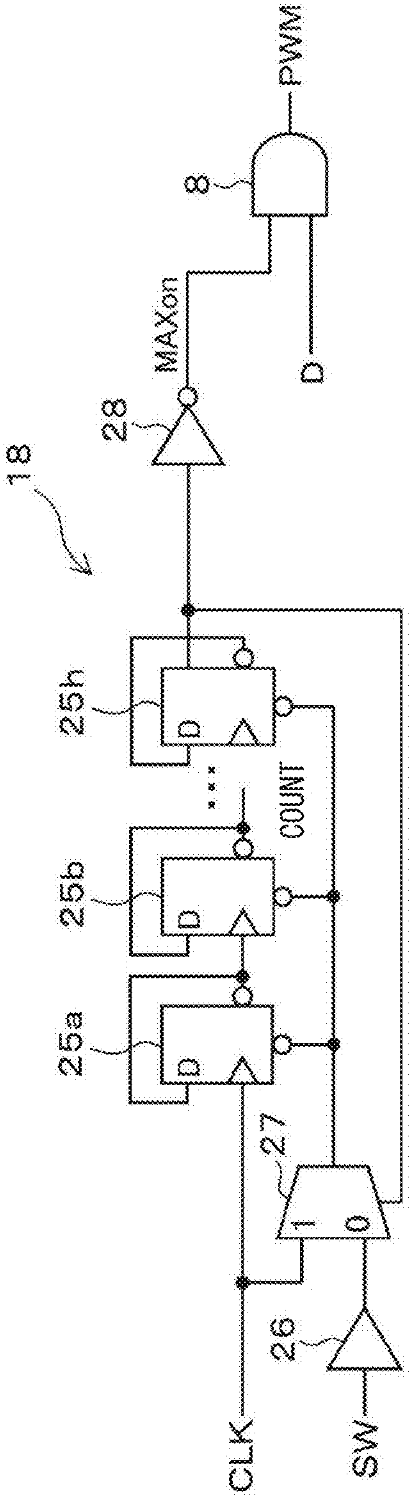
FIG. 3 is a circuit diagram showing a detailed configuration of an ON time counter.

The ON time counter 18, which corresponds to a low level setting unit, is a counter that counts the time during which the high-side switch 2 maintains the on state. As shown in FIG. 3, the ON time counter 18 includes eight D flip-flops 25*a* to 25*h* connected in series, a buffer 26, a selector 27, and a NOT gate 28. The inversion output terminal of each D flip-flop 25 is connected to the input terminal D of the respective D flip-flop 25.

The clock signal CLK is input from the CLK generation circuit 19 to the clock terminal of the first-stage D flip-flop 25*a* and to the "1" side of the selector 27. When the voltage at the common connection point of the switches 2 and 3 is defined as SW, the voltage SW is input to the "0" side of the selector 27 via a buffer 26. The output terminal of the selector 27 is connected to the negative logic reset terminal R of each D flip-flop 25. The "1 and 0" switching control of the selector 27 is performed by the non-inversion output of the D flip-flop 25*h* in the final stage. The non-inversion output terminal of the D flip-flop 25*h* is given to the input terminal of the AND gate 8 via a NOT gate 28.

Figure 4:
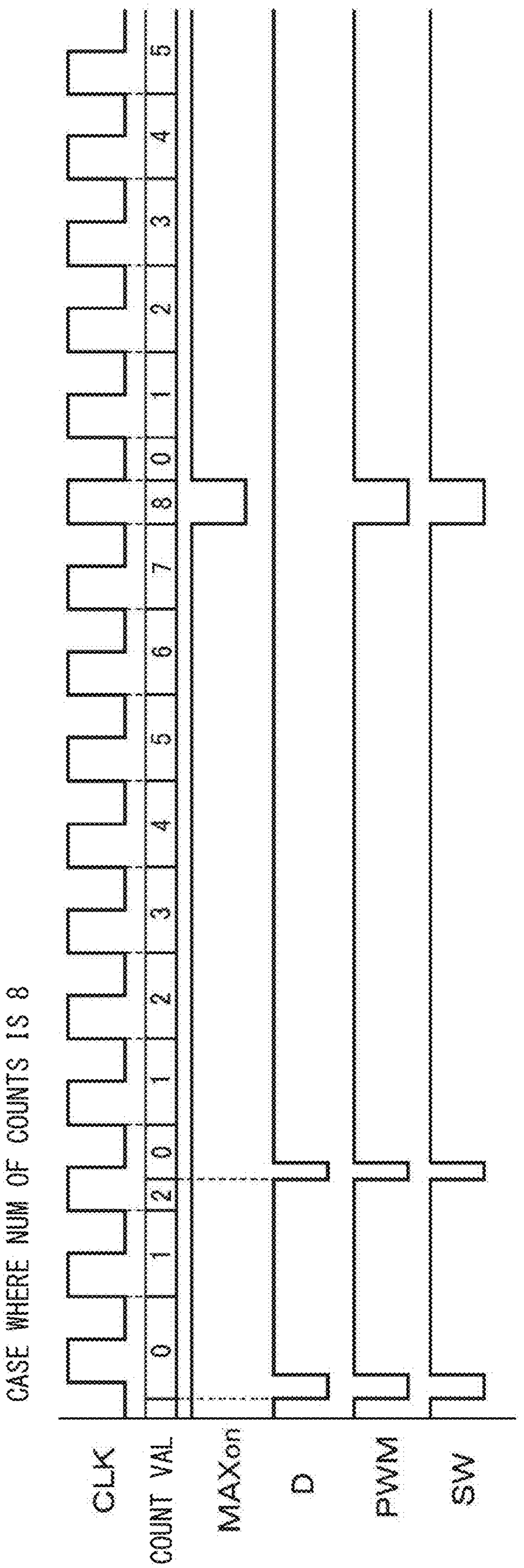
FIG. 4 is a timing chart showing the operation of an ON time counter.

As shown in FIG. 4, the output signal MAXon of the NOT gate 28 remains at a high level until the pulse count number of the clock signal CLK reaches "8". When the count number reaches "8", the signal MAXon changes to a low level for a half period of the clock signal CLK.

Figure 5:
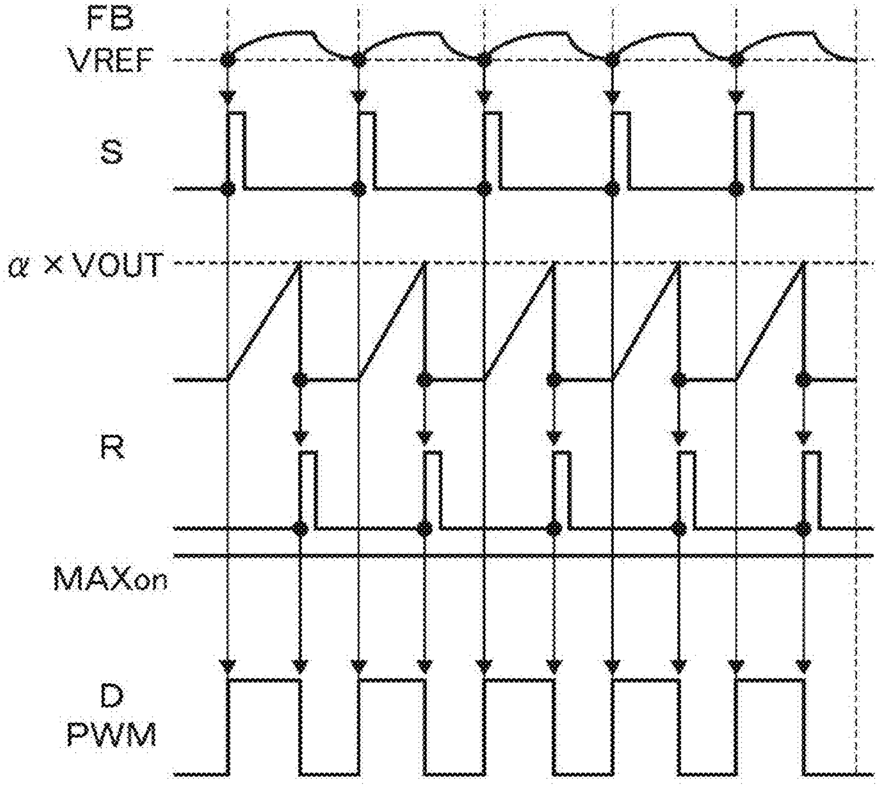
FIG. 5 is a diagram showing a PWM signal output in a state where an input voltage VIN is higher than an output voltage VOUT.

Next, the operation of the present embodiment will be described. As shown in FIG. 5, when the voltage FB falls below the reference voltage VREF, the RS latch 14 is set and the PWM signal rises. At the same time, the switch circuit 23 of the Ton calculation unit 12 is turned off and the capacitor 22 is charged with the constant current I. When the terminal voltage of the capacitor 22 reaches a value α times the output voltage VOUT, the output signal of the comparator 24 changes from the low level to the high level, and the RS latch 14 is reset. The time from when the RS latch 14 is set to when the RS latch 14 is reset is defined as the time Ton. This feature is the normal COT control.

Figure 6:
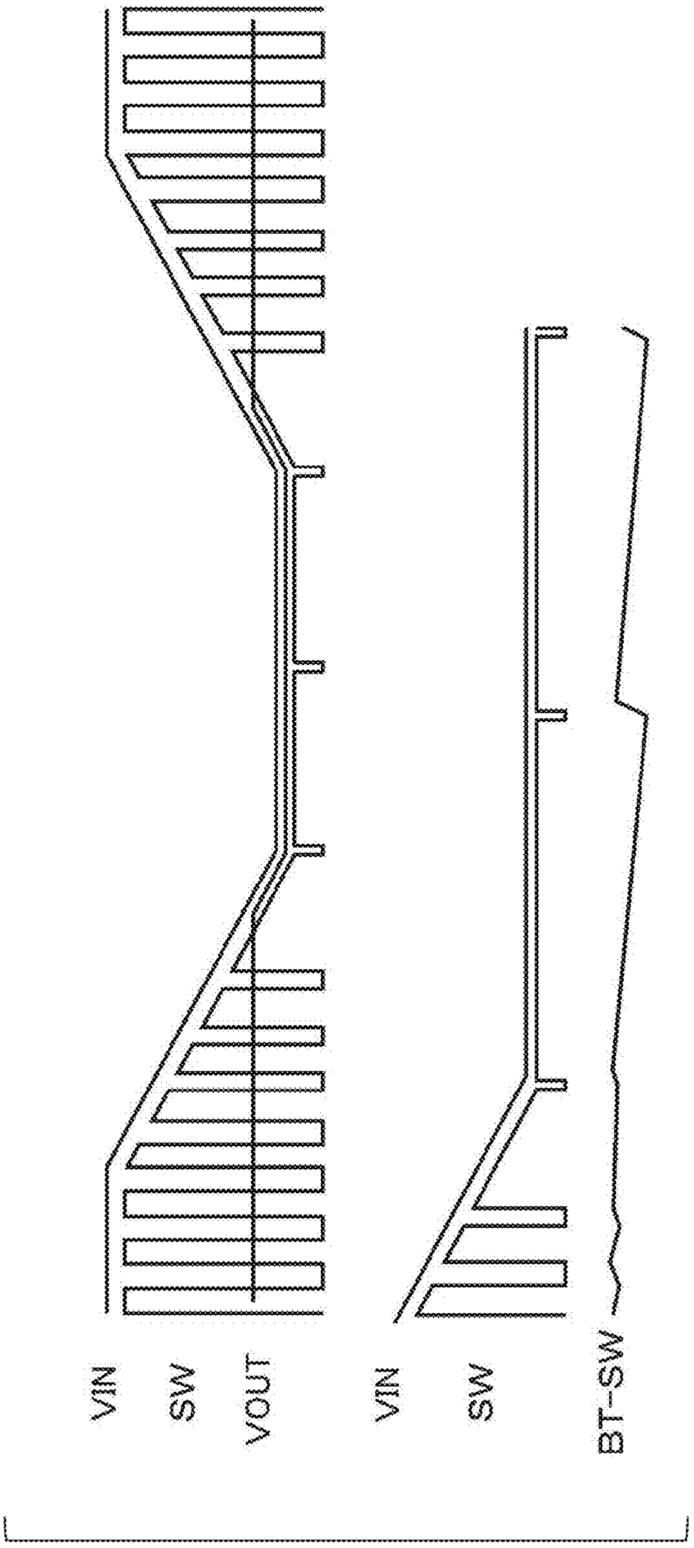
FIG. 6 is a diagram showing a PWM signal output when an input voltage VIN gradually decreases from a state where the input voltage VIN is higher than an output voltage VOUT.
Figure 7:
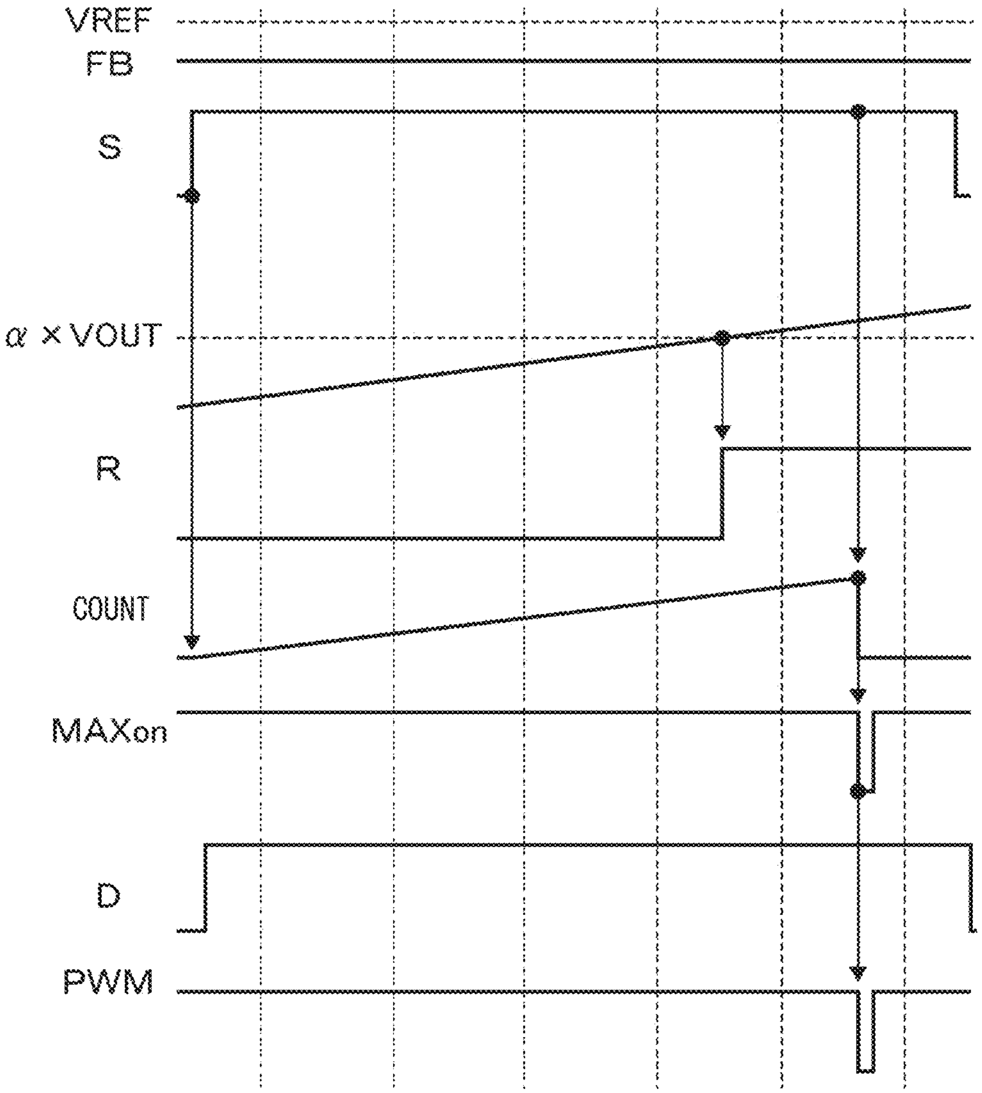
FIG. 7 is an enlarged diagram of a portion of FIG. 6.

On the other hand, as shown in FIGS. 6 and 7, when the input voltage VIN gradually decreases from a state where the input voltage VIN is higher than the output voltage VOUT, the on-time of the high-side switch 2 gradually becomes longer so that the output voltage VOUT does not decrease accordingly. When the input voltage VIN becomes lower than the output voltage VOUT, the on time becomes longer, and there is a risk that the charge stored in the boost capacitor 11 will be depleted.

Therefore, in this embodiment, the ON time counter 18 monitors the voltage SW to measure the time that the high-side switch 2 maintains the ON state, and when that time reaches a time equivalent to the threshold number of clock pulses "8", the signal MAXon is made low level, and the high-side switch 2 is forcibly turned off via the AND gate 8. At this time, the boost capacitor 11 is charged.

As described above, according to this embodiment, the switching power supply device 1 generates the stepped-down output voltage VOUT by switching the input voltage VIN using the high-side switch 2 and the low-side switch 3, which are N-channel MOSFETs. The LDO 9 generates a drive power supply for driving the switches 2 and 3 by charging a boost capacitor 11.

When the voltage division signal FB falls below the target voltage VREF, the off-time generation unit 17 sets the gate voltage of the high-side switch 2 to a high level. The Ton calculation unit 12 has a current source circuit 21 in which the value of a constant current I is adjusted depending on the input voltage VIN, and sets the gate voltage of the high-side switch 2 to a low level depending on the result of comparing the terminal voltage of a capacitor 22 to be charged by the constant current I with a voltage obtained by multiplying a times the output voltage. The RS latch 14 prioritizes setting the gate voltage to a high level when the off time generation unit 17 is outputting a signal for setting the gate voltage to a high level.

With this configuration, even if there is a conflict between the control by the off-time generation unit 17 to set the gate voltage of the high-side switch 2 to a high level and the control by the Ton calculation unit 12 to set the gate voltage of the high-side switch to a low level, the gate voltage will be maintained at a high level by the RS latch 14. Therefore, even under the COT control, the boost capacitor 11 can be charged for a longer period of time.

When the time during which the gate voltage of the high-side switch 2 remains at a high level exceeds a threshold, the ON-time counter 18 forcibly sets the gate voltage to a low level. As a result, even if the time during which the gate voltage shows a high level becomes longer as a result of a reduction in the input voltage VIN, the boost capacitor 11 can be reliably charged by turning off the high-side switch 2 using the Ton calculation unit 12.

Second Embodiment

Figure 8:
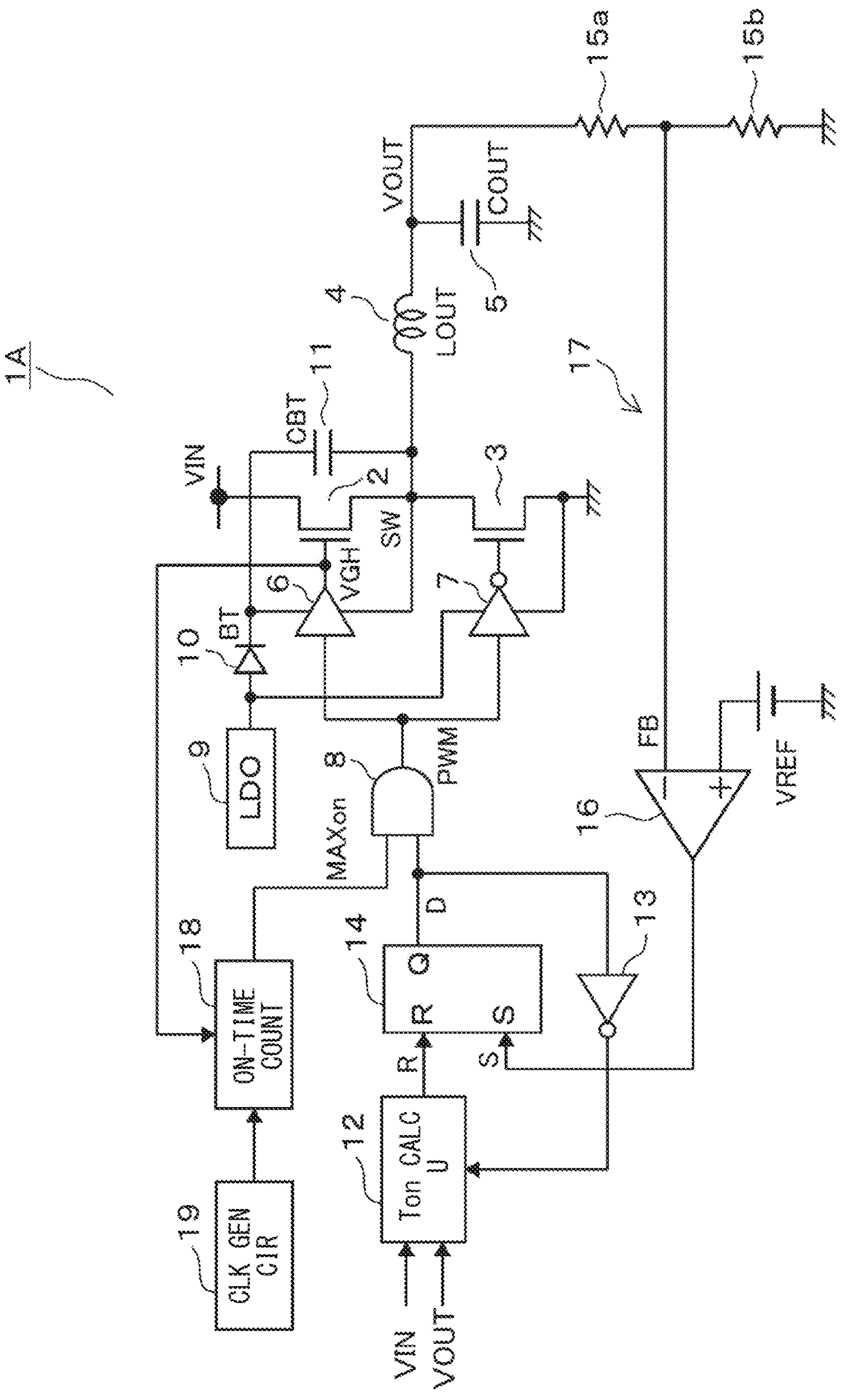
FIG. 8 is a diagram showing a configuration of a switching power supply device in a second embodiment.

Hereinafter, the identical parts as those in the first embodiment will be designated by the same reference numerals for simplification of the description. Only differences from the first embodiment will be described below. As shown in FIG. 8, the switching power supply device 1A of the second embodiment differs from the first embodiment only in that the input terminal of the ON time counter 18 is connected to the gate of the high-side switch 2 instead of the common connection point of the switches 2 and 3.

Third Embodiment

Figure 9:
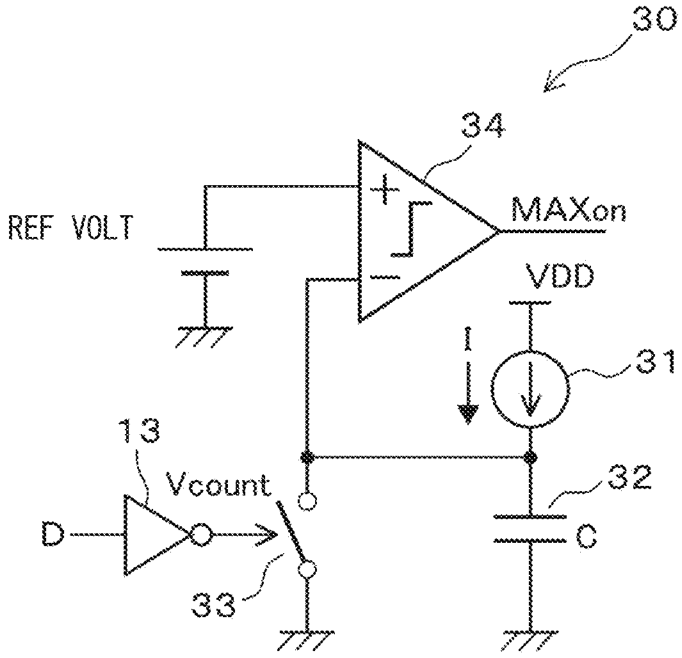
FIG. 9 is a circuit diagram showing a detailed configuration of an ON time counter in a third embodiment.

As shown in FIG. 9, in the third embodiment, an ON time counter 30 instead of the ON time counter 18 is used. The ON time counter 30 has a similar configuration to the Ton calculation unit 12, and includes a series circuit of a current source circuit 31 and a capacitor 32 connected between a power supply VDD and the ground, and a comparator 34 having a non-inversion input terminal to which the reference voltage is input and an inversion input terminal connected to a common connection point of the current source circuit 31 and the capacitor 32 and also connected to the ground via a switch circuit 33. The on/off state of the switch circuit 33 is controlled by a NOT gate 13.

Figure 10:
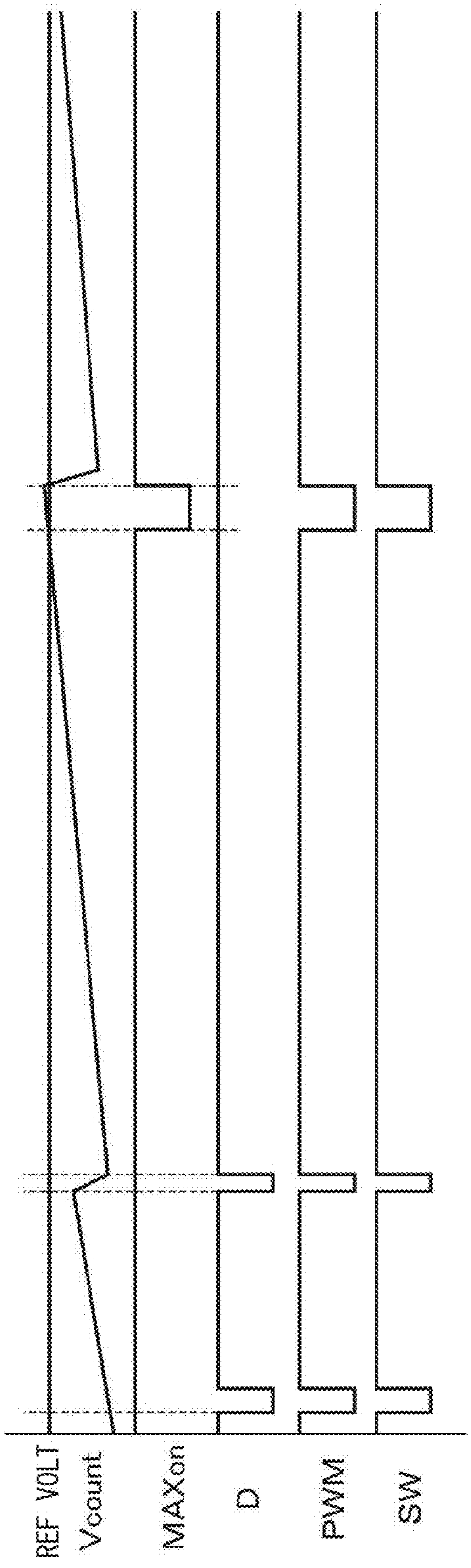
FIG. 10 is a timing chart showing the operation of an ON time counter.

As shown in FIG. 10, in the operation of the ON time counter 30, a comparator 34 compares the terminal voltage Vcount of the capacitor 32 with a reference voltage, and when the level of the terminal voltage Vcount exceeds the level of the reference voltage, the comparator 34 sets the signal MAXon to a low level. This causes the high-side switch 2 to be turned off, and the boost capacitor 11 to be charged.

Fourth Embodiment

Figure 11:
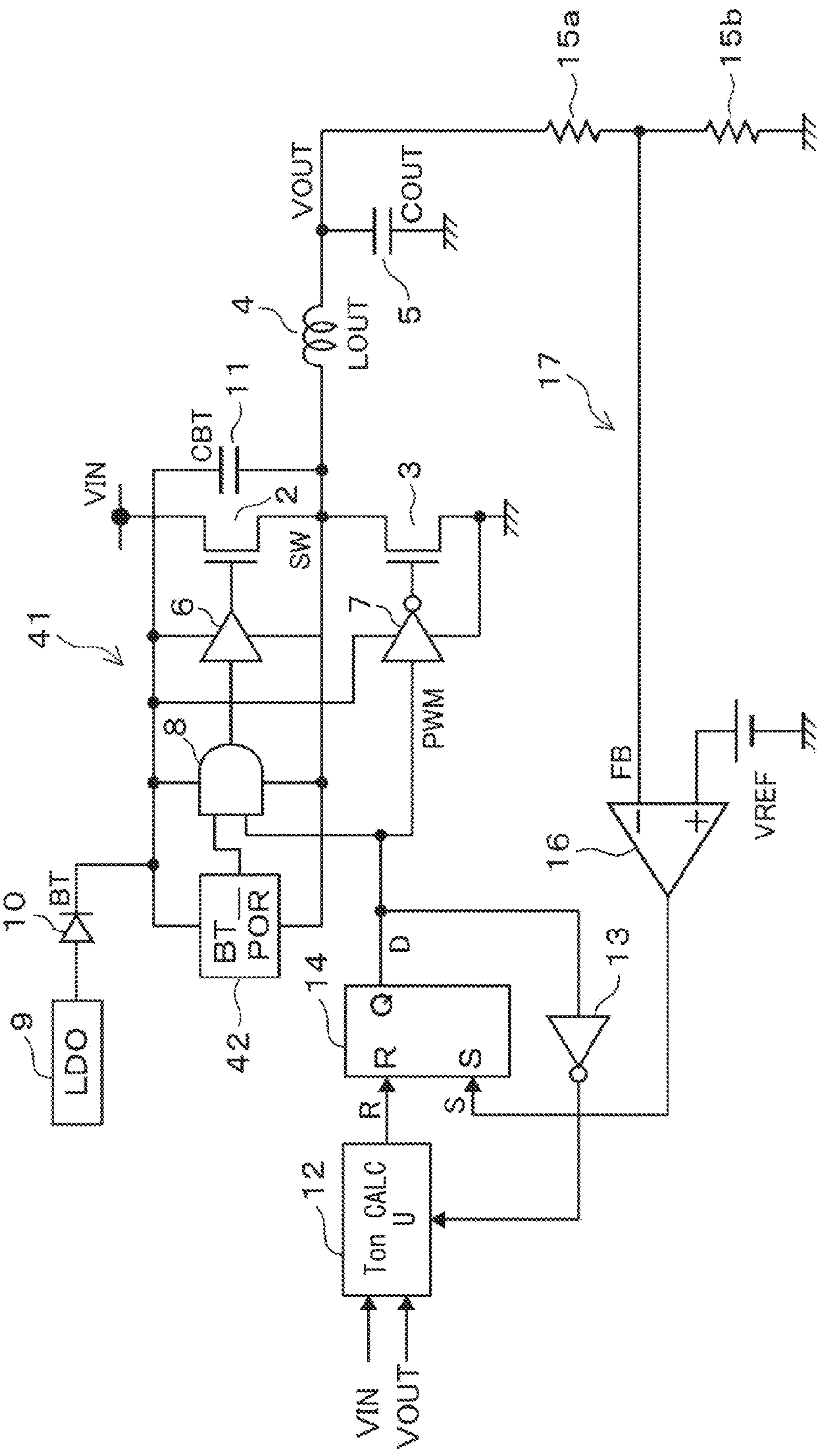
FIG. 11 is a diagram showing a configuration of a switching power supply device in a fourth embodiment.

As shown in FIG. 11, a switching power supply device 41 of the fourth embodiment uses a BT-SW voltage detection unit 42 instead of the ON time counter 18. The BT-SW voltage detection unit 42 is connected between the cathode BT of the diode 10 and the source SW of the high-side switch 2. The driving power for the inversion driver 7 is also supplied from the cathode of the diode 10.

Figure 12:
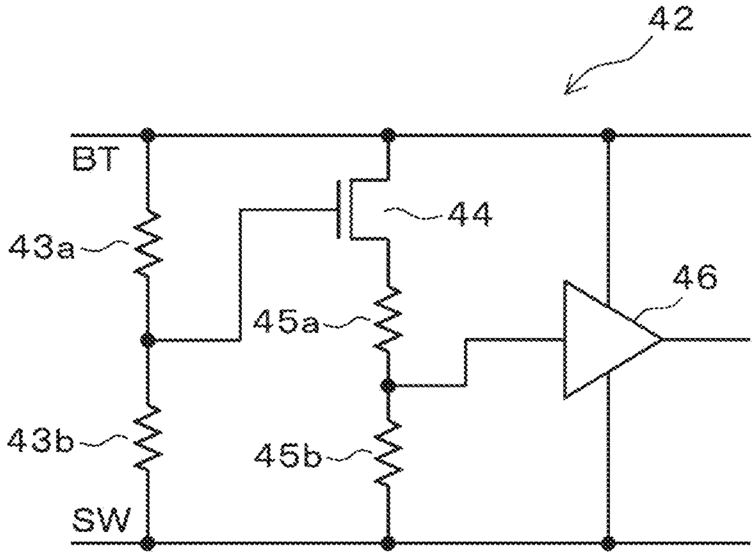
FIG. 12 is a circuit diagram showing a detailed configuration of a BT-SW voltage detection unit.

As shown in FIG. 12, the BT-SW voltage detection unit 42 includes a series circuit of resistor elements 43*a* and 43*b* connected between the terminals BT and SW, a series circuit of an N-channel MOSFET 44 and resistor elements 45*a* and 45*b*, and a buffer 46. The gate of the FET 44 is connected to the common connection point of the resistor elements 43*a* and 43*b*. The input terminal of the NOT gate 46 is connected to the common connection point of the resistor elements 45*a* and 45*b*. The output terminal of the NOT gate 46 is connected to the input terminal of the AND gate 8.

Figure 13:
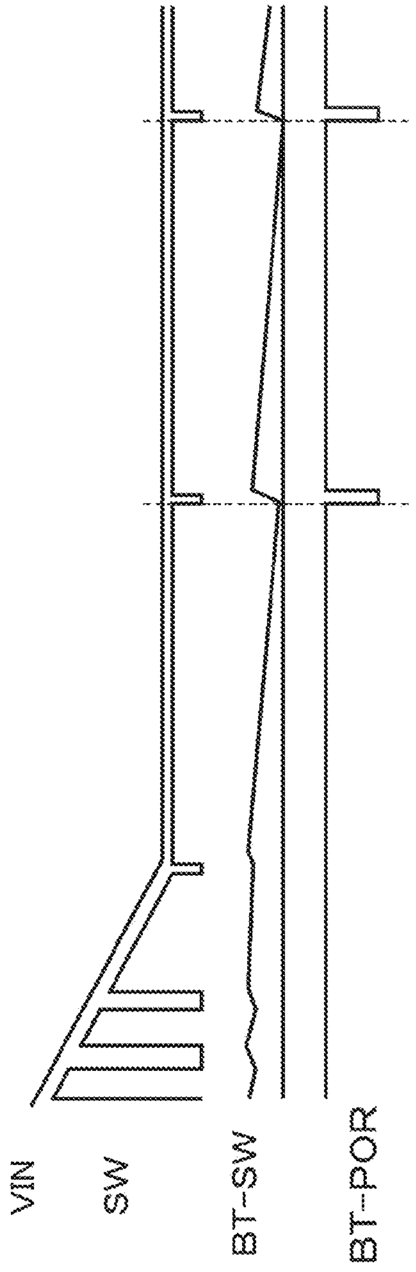
FIG. 13 is a timing chart showing the operation of a BT-SW voltage detection unit.

As shown in FIG. 13, in the BT-SW voltage detection unit 42, when the BT-SW voltage is high and the gate voltage of the FET 44 exceeds the threshold value, the FET 44 is in the on state, and the signal BT-POR to be output via the buffer 46 indicates a high level. When the BT-SW voltage drops and the gate voltage of the FET 44 falls below the threshold, the FET 44 turns off. This causes the signal BT-POR to change to a low level.

OTHER EMBODIMENTS

Figure 14:
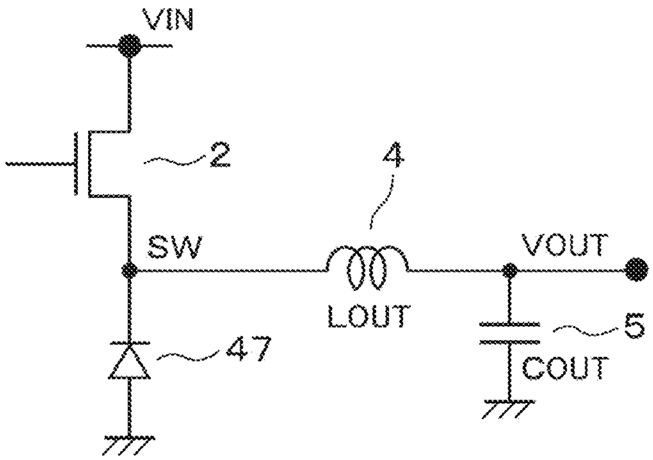
FIG. 14 is a diagram showing another configuration example of the power stage.

FIG. 14 shows another example of the configuration of a power stage that performs switching, in which a diode 47 is arranged instead of the low-side switch 3. The count number of the Ton time calculation unit 18 may not be limited to "8".

Although the present disclosure has been described according to the embodiments, it is understood that the present disclosure is not limited to the above-described embodiments or structures. The present disclosure includes various modification examples and equivalents thereof. Furthermore, various combination and formation, and other combination and formation including one, more than one or less than one element may be made within the spirit and scope of the present disclosure.

What is claimed is:

1. A switching power supply device for generating an output voltage transformed by switching an input voltage using a high side switch which includes at least an N-channel MOSFET, the switching power supply device comprising:

a bootstrap circuit that includes a boost capacitor having one end connected to a low potential side conduction terminal of the high side switch and generates a drive power supply for driving the high side switch;

an off time generation unit that sets a gate voltage of the high side switch to be high level when a division voltage signal of the output voltage falls below a target voltage;

an on time calculation unit that includes a current source circuit in which a value of a constant current is adjusted depending on the input voltage, and sets a gate voltage of the high side switch to be a low level according to a result of comparison between a terminal voltage of a capacitor to be charged by the constant current and a voltage obtained by multiplying the output voltage by a gain;

a high level priority unit that prioritizes setting the gate voltage to be a high level when the off time generation unit is outputting a signal for setting the gate voltage to be a high level; and a low level setting unit that forcibly sets the gate voltage to be a low level when the time during which the gate voltage indicates a high level exceeds a threshold value.

2. The switching power supply device according to claim 1, wherein:

the low level setting unit includes a counter that measures the time during which the gate voltage indicates a high level.

3. The switching power supply device according to claim 1, wherein:

the low level setting unit includes:

a ramp wave signal generation unit that generates a ramp wave signal by combining a current source, a capacitor that is charged by current of the current source, and a discharging switching element that discharges the capacitor during the time in which the gate voltage indicates a low level; and a comparison circuit that compares the ramp wave signal with a reference voltage.

4. The switching power supply device according to claim 1, wherein:

the low level setting unit includes a voltage detection unit that detects a terminal voltage of the boost capacitor, and forcibly sets the gate voltage to be a low level when the terminal voltage falls below a threshold value.

5. The switching power supply device according to claim 1, wherein:

the on time calculation unit includes:

a ramp wave signal generation unit that generates a ramp wave signal by combining the current source circuit and a discharging switching element that discharges the capacitor during the time in which the gate voltage indicates a low level; and a comparison circuit that compares the output voltage with the ramp wave signal.

* * * * *